（12） United States Patent
Duvvury et al.

(10) Patent No.: US 7,212,387 B2
(45) Date of Patent: May 1, 2007

(54) ELECTROSTATIC DISCHARGE PROTECTION DEVICE INCLUDING PRECHARGE REDUCTION

(75) Inventors: Charvaka Duvvury, Plano, TX (US); Chih-Ming Hung, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 221 days.

(21) Appl. No.: 10/944,299

(22) Filed: Sep. 17, 2004

(65) Prior Publication Data
US 2006/0061929 A1   Mar. 23, 2006

(51) Int. Cl.
*H02H 9/00*   (2006.01)
(52) U.S. Cl. .................. 361/56; 361/91.1; 361/111; 361/118; 257/355
(58) Field of Classification Search ............... 361/56, 361/91.1, 111, 118; 257/355
See application file for complete search history.

(56) References Cited

U.S. PATENT DOCUMENTS 3,806,829 A * 4/1974 Duston et al. ........... 372/38.01
5,336,908 A * 8/1994 Roberts ...................... 257/173
5,514,919 A * 5/1996 Walley ....................... 307/109
5,615,073 A * 3/1997 Fried et al. ................... 361/56
5,946,175 A * 8/1999 Yu .............................. 361/56
6,552,886 B1 * 4/2003 Wu et al. ..................... 361/56
6,924,963 B2 * 8/2005 Young et al. ............... 361/111

* cited by examiner

*Primary Examiner*—Stephen W. Jackson
*Assistant Examiner*—Terrence Willoughby
(74) *Attorney, Agent, or Firm*—Jacqueline J. Garner; W. James Brady, III; Frederick J. Telecky, Jr.

(57) ABSTRACT

ESD protection circuitry for a signal power supply pad (801) comprising a discharge circuit (802) operable to discharge the ESD pulse to ground, and a precharge reduction circuit (810) in parallel with the discharge circuit. This precharge reduction circuit is operable to cancel any precharge voltage to ground before an ESD event, and also to discharge any trailing pulse to ground after an ESD event. The reduction circuit comprises a discharge resistor (811), preferably about 10 kΩ, connected to the discharge circuit, and a control MOS transistor (812) in series with the discharge resistor. The transistor source (812*a*) is connected to the resistor, the drain (812*b*) to ground, and the gate (812*c*) to core power (813) so that the transistor is shut off during IC operation and conducting when pre-charge or post-charge is present at an ESD pulse.

10 Claims, 4 Drawing Sheets

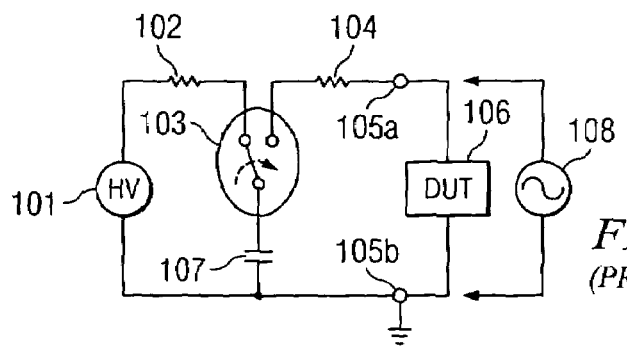
FIG. 1A (PRIOR ART)
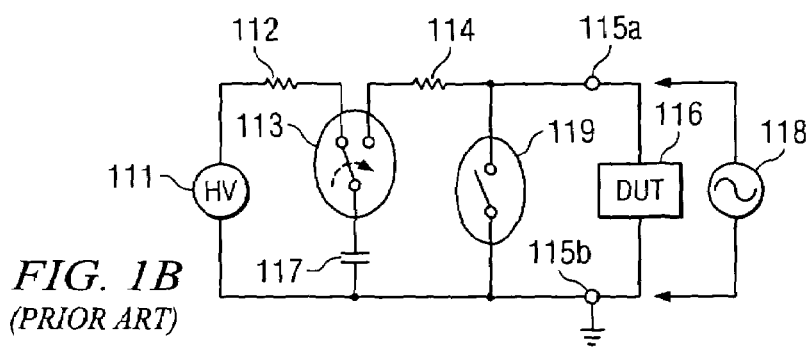
FIG. 1B (PRIOR ART)
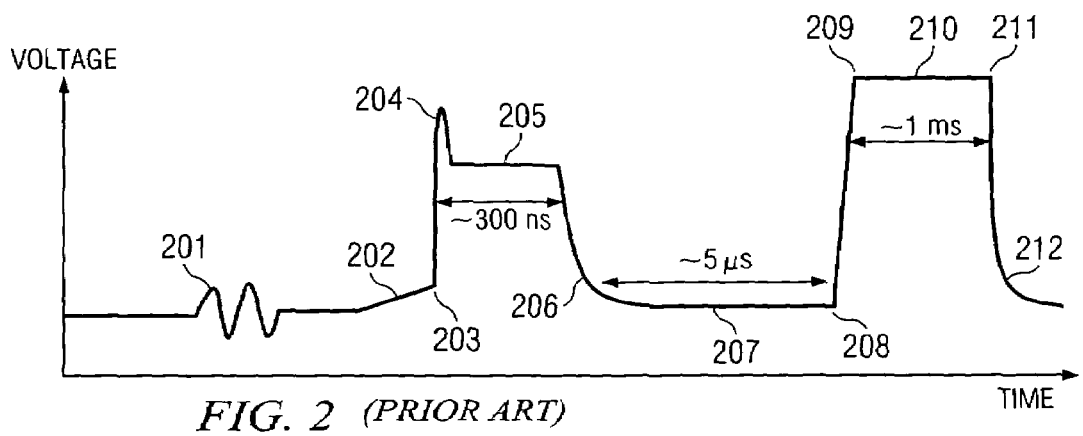
FIG. 2 (PRIOR ART)
FIG. 3 (PRIOR ART)
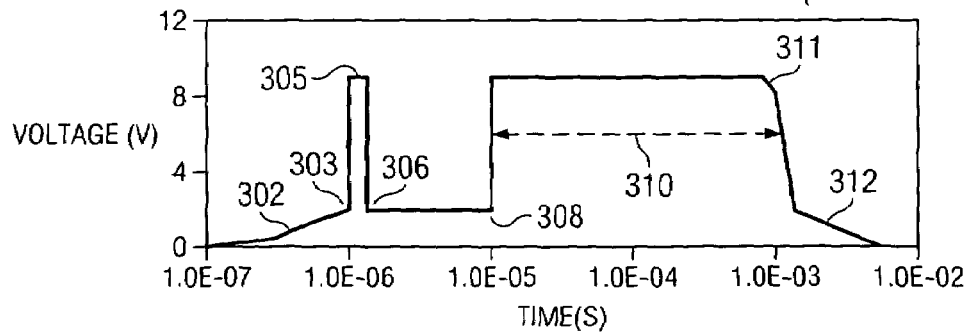

ELECTROSTATIC DISCHARGE PROTECTION DEVICE INCLUDING PRECHARGE REDUCTION

FIELD OF THE INVENTION

The present invention is related in general to the field of electronic systems and semiconductor devices and more specifically to structure and method of electrostatic discharge devices including precharge reduction features.

DESCRIPTION OF THE RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the "Machine model", MM); it can generate transients with significantly higher rise times and current levels than the HBM ESD source. A third source is described by the "charged device model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions (the bipolar turn-on at snap-back occurs at the collector/drain voltage Vt1 with an associated collector/drain current It1), is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level. The second breakdown trigger current It2 is widely used as an ESD strength monitor.

It has recently been found that the relentless scaling trend in semiconductor technologies has made the ESD protection devices much more sensitive to noise generated by the high pin-count testers, which are routinely used to evaluate semiconductor products for sensitivity to HBM and MM stresses. A further trend is that IC products migrate towards high pin-count products. ESD testers, however, have not kept up with the increased parasitics of the high pin count sockets and boards that are used to test the ICs. Obviously, the testers have to be trustworthy in order to deliver undistorted pulses to evaluate the ESD robustness of semiconductor products, but the testers have been found to be severely lacking unambiguous testing performance.

Noise pulses are generated by the testers during different time periods of an ESD event, both before and after the event; specifically, pulses trailing the ESD event were found which are not within the intended JEDEC or ESDA test methods. The trailing pulse can falsely cause oxide stress; as a result, the input parametrics of input high (VIH) and/or input low (VIL) can shift to undesirable levels and the units are declared a not passing ESD. Consequently, the test results have been found to be misleading with respect to the ESD evaluation of semiconductor products. Such false data may not only lead to wasted resources, lost time, and customer misunderstanding, but also lead to situations where true versus false ESD levels are not determined properly.

SUMMARY OF THE INVENTION

A need has therefore arisen to develop a concept for integrated circuit (IC) pads so that any spurious voltage build-up before an ESD event and any trailing voltage pulse after an ESD event can be disabled by discharging them to ground. The full ESD protection capability available at each pad is thus be restored and available in undiminished strength to discharge the ESD pulse.

One embodiment of the invention is ESD protection circuitry for an I/O power pad comprising a discharge circuit operable to discharge the ESD pulse to ground, and a precharge reduction circuit in parallel with the discharge circuit. This precharge reduction circuit is operable to cancel any precharge voltage to ground before an ESD event, and also to discharge any trailing pulse to ground after an ESD event. The reduction circuit comprises a discharge resistor, preferably about 10 kΩ, connected to the discharge circuit, and a control MOS transistor in series with the discharge resistor. The transistor source is connected to the resistor, the drain to ground, and the gate to core power so that the transistor is shut off during IC operation and conducting when pre-charge or post-charge is present at an ESD pulse.

In another embodiment intended for protecting internal circuit (core) power pads, the source of the control transistor is connected the discharge resistor (preferably about 10 kΩ), the drain to ground, and the gate to I/O power.

In yet another embodiment intended for protecting input/output (I/O) pins, the source of the control transistor is connected to the discharge resistor (preferably about 10 kΩ), the drain to ground, and the gate to I/O power; in this embodiment, the transistor body is connected to core power.

Embodiments of the present invention are related to the testing of advanced deep submicron technology devices with shallow trench isolation, especially salicided nMOS transistors. Such transistors are for instance employed in wireless devices, or in Application Specific products, or in mixed signal and logic devices.

A technical advantage of the invention is its simplicity so that it can easily be adopted into any integrated circuit and integrated circuit testing methodology.

Another technical advantage of the invention is its universal application. Whether actual HBM involves the pre-charge or the post-charge event, the pre-charge reduction circuit according to the invention eliminates any ESD failures from malfunction of the protection devices.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1A shows a schematic and simplified circuit diagram of the ESD tester as used in known technology for testing a semiconductor device according to the Human Body Model.

FIG. 1B shows a schematic and simplified circuit diagram of the ESD tester as used in known technology for testing a semiconductor device according to the Machine Model.

FIG. 2 illustrates schematically the voltage observed at the tester socket as a function of time.

FIG. 3 displays the voltage vs. time curve of

FIG. 2 in a simplified manner to highlight its important features.

DETAILED DESCRIPTION OF THE PREFERRED EMBODIMENTS

Figure 4:
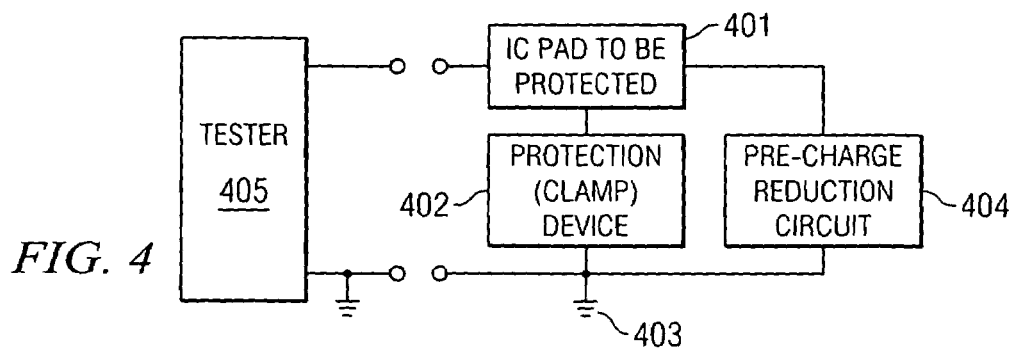
FIG. 4 is simplified schematic circuit diagram of the pre-charge and post-charge reduction circuit according to an embodiment of the invention.

The impact of the invention can be most easily appreciated when compared with the shortcomings of the known technology. FIG. 1A depicts a schematic and simplified circuit diagram of the ESD testers as they are routinely employed by known technology to test semiconductor product from various technologies according to the requirements of the Human Body Model (HBM). FIG. 1B depicts a similar schematic and simplified circuit diagram of ESD testers for testing semiconductor products according to the requirements of the Machine Model (MM). The high voltage generator 101 delivers about 8 kV (up to 15 kV) and is connected, through first resistor 102 of about 1 to 5 MΩ, to the on/off switch relay 103. Typically, commercial testers employ relays 103 which operate in a partially ionized ambient and are thus inclined to arc; in the case of arcing, the high voltage supply 101 is able to provide a leakage current.

Relay 103 is connected, through a second resistor 104 of about 1.5 kΩ, to the sockets 105a and 105b for the device-under-test 106. Socket 105b is at ground potential. A capacitor 107 of about 100 pF is connected to relay 103, to the high voltage generator 101, and to the socket 105b for the device-under-test 106. Capacitor 107 is operable to discharge high energy pulses through device 106. An oscilloscope 108 monitors the observed voltage versus time waveforms, which are experienced by device 106.

The tester in FIG. 1B for the MM is aimed at simulating abrupt discharge events, which are caused by contact with equipment and empty sockets, for instance in functional device tests, burn-in, and reliability, testing. The model is sensitive to parasitics; control of the testers to comply with standards is difficult. High voltage source 111 delivers up to about 2 kV; resistor 112 is typically between about 1 to 10 MΩ, while the resistor 114 may be as low as 0 Ω. The first on/off switch relay 113 operates in a partially ionized ambient and is thus inclined to arc, in that case, the high voltage supply 111 is able to provide a leakage current. Between sockets 115a and 115b for the device-under-test 116 is the second switch 119. Capacitor 117 is about 200 pF. An oscilloscope 118 monitors the observed voltage versus time waveforms, which are experienced by device 116.

FIG. 2 records schematically the voltage (ordinate) versus time (abscissa) waveforms experienced by a contemporary device 106, produced in scaled technology, in socket 105, using an HBM and MM tester according to the schematic diagrams of FIGS. 1A and 1B. It should be pointed out that the time axis of FIG. 2 is not to scale. The region 201 shows some erratic early rise ringing due to electromagnetic cable interference (coupling between relay and cables). At 203, the circuit switch is being closed and the HBM test starts. Just prior, at 202, some voltage pre-charge due to arcing is recorded; this region is not part of the test standard and could give rise to false ESD results.

At 204, some inductive ringing due to the fast dV/dt is seen, just prior to the triggering of the ESD protection device at 205. The protection device clamps at about 5 to 10 V. The length of time of the protection device action is listed as approximately 0.3 to 0.5 µs before the end of the HBM test at 206. During the long turn-off of the ESD event, due to the decaying current, the voltage reduces to near zero for a length of time of approximately 5 µs (curve portion 207 in FIG. 2) and then brings the protection device out of snapback at point 208, rising the potential to its Vt1 of about 9.3 V Long after the ESD pulse is expected to be over (after about 5 to 10 µs), a trailing pulse begins at 209 and continues for a surprisingly long duration of about 700 to 1000 µs (curve portion 210), before it terminates at 211 and starts to slowly decrease at 212. In this critical region, a current of about 300 µA is seen, supplied by the high voltage source (101 in FIG. 1) . The origin of this misleading trailing pulse is an arcing in the test relay, where the high voltage supply provides the leakage current. This current magnitude is proportional to the stress voltage level. The renewed clamping is again at about 9.3 V, since current is supplied to the protection device to only reach its trigger point but not its designed clamping voltage. Clearly, region 210 is not part of the test standard and gives rise to false ESD results. The duration of region 210 coupled with the magnitude of the current frequently causes a degradation of the oxide layer of the device-under-test, producing an erroneous failure result. For the thin oxide layer of many products, a current of even 10 µA, flowing for a period of about 1000 µs, is already enough to damage the oxide layer.

The trailing pulse 210 is caused by the way the ESD tester charges its capacitor and by a phenomenon inside the high voltage relay. Typically, the high voltage supply inside the tester is connected to the charge storage capacitor through a high value resistor, on the order of 1 to 10 MΩ and the normally closed contact of the high voltage relay. The intent is that, when the relay is activated, the capacitor will be disconnected from this charging source and connected to the about 1.5 kΩ resistor and device-under-test. What actually happens, though, is that when the relay actuates, there is a trail of ionized gas or plasma between the normally closed contact and the armature. The armature swings over to the normally open contact and the capacitor discharges into the device-under-test, causing the desired ESD stress, but the charging circuit is still connected to the armature via the plasma. This means that the ESD stress does not decay to zero as intended, but decays down to the value of the charging current, which may be as high as hundreds of μA. This charging current remains applied to the device-under-test until the plasma dissipates, typically in about 1 ms. This long tail or trailing pulse is not something seen in the real world because the charging source is not continuously applied to people. They build up a charge from moving around and then hold the charge until they touch something. After they discharge, there is no charging current to flow into the pin.

The HBM voltage curve in FIG. 3 repeats the essential elements of the curve in FIG. 2, redrawn onto a more quantitative voltage ordinate and logarithmic time abscissa. Pre-charge curve portion 302 corresponds to curve portion 202; the HBM test starts at 303. The voltage level 305 (typically between 5 to 10 V) is determined by the clamp device. The HMB test ends at 306. At 308, the unwarranted trailing pulse begins and lasts for the time period 310, before it subsides at 311 and slowly decays at 312.

FIG. 4 illustrates schematically the simplified circuit diagram of the concept of the invention. The device-to-be-tested, for instance an integrated circuit (IC), has pad 401 to be protected. The protection device is designated 402; an example of a protective discharge circuit suitable for many different pads is described in FIG. 9. The discharge circuit 402 discharges the ESD pulse to ground potential 403. In parallel with discharge device 402 is pre-charge reduction circuit 404, which is operable to cancel any pre-charge voltage to ground 403 before an ESD event, and also to discharge any post-charge voltage (trailing pulse) to ground 403 after an ESD event.

Pre-charge reduction circuit 404 operates whether the pre-charge and the trailing pulse are generated by a function of test equipment 405, or by an impending ESD event.

Figure 5:
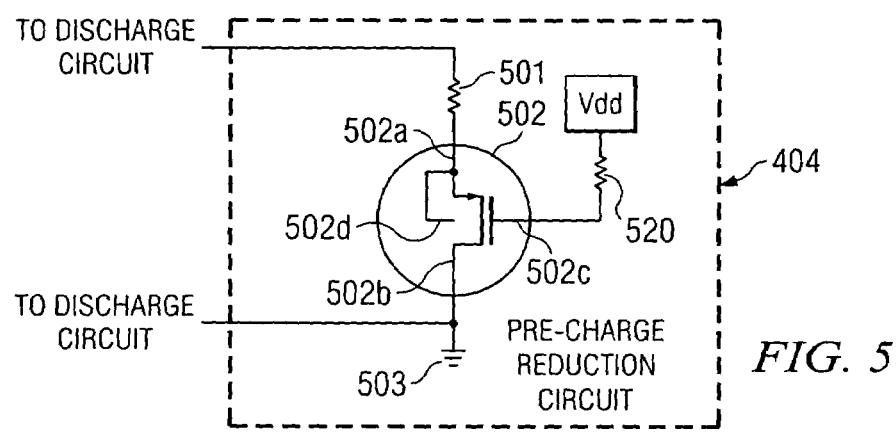
FIG. 5 is a schematic circuit diagram of the charge reduction circuit according to an embodiment of the invention.

Pre-charge reduction circuit 404 is displayed in more detail in FIG. 5. Circuit 404 comprises a discharge resistor 501, which is connected to the discharge circuit (protection device). Resistor 501 is a large resistor and has preferably a value between 1 and 100 kΩ, more preferably about 10 kΩ. In series with resistor 501 is a control transistor 502, in the example of FIG. 5 shown as a pMOS transistor. The source 502a of transistor 502 is connected to resistor 501. The drain 502b of transistor 502 is connected to ground potential 503. The gate 502c of transistor 502 is connected through resistor 510 to Vdd (power) so that transistor 502 is shut off during regular operation of the integrated circuit, but is conducting when a pre-charge or a post-charge is present in conjunction with an ESD pulse. The resistor 510, preferably between about 1 and 10 kΩ, provides protection for the "charged device model" (CDM) stress. In FIG. 5, transistor body (substrate) 502d is connected to source 502a.

Figure 6:
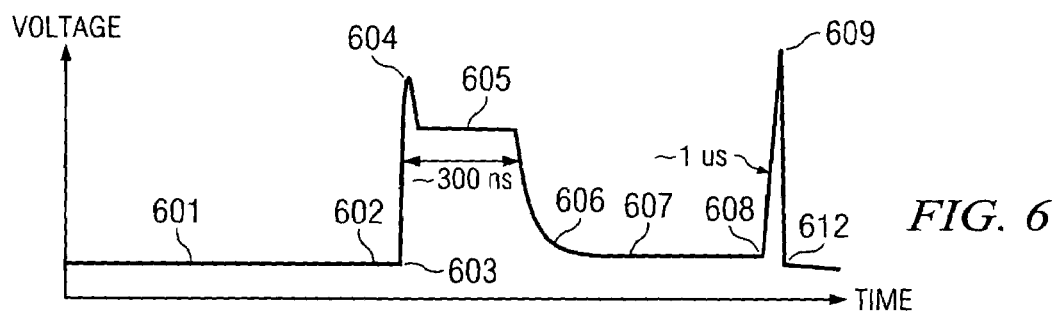
FIG. 6 illustrates schematically the voltage waveform across the device-under-test under HBM stress after the pre-charge reduction circuit has been implemented.

The impact of the pre-charge reduction circuit is the cancellation of the pre-charge voltage and the trailing pulse voltage. This effect is schematically illustrated in FIG. 6 by the voltage waveforms across the device-under-test under HBM stress. The stress may be an actual ESD event or a HBM test. The voltage is plotted linearly on the ordinate, and the time on the abscissa is not to scale. The contrast of this waveform to the unimproved standard version in FIG. 2 is evident. There is no early rise ringing in curve portion 601. There is no pre-charge in curve portion 602 before the start of the HBM event, or test, at 603. At 604, some inductive ringing due to the fast dV/dt is seen, just prior to the triggering of the ESD protection device at 605. The protection device clamps at about 5 to 6 V. The length of time of the protection device action is shown as approximately less than 1.0 μs before the end of the HBM event at 606. During the time period of the event or test, the current amplitude of the test pulse shows very little change compared to the current amplitude of the pulse in FIG. 3. The operation of the protection device is undisturbed and the current decays as anticipated; the voltage is at zero in regime 607.

With the embodiment of the invention, there is nothing like the excessively long trailing pulse of about 1000 μs shown in FIG. 2. As FIG. 6 demonstrates, a small residual pulse 609 having very little current may get started at 608, for instance as a discharge from the tester, but the pulse has expired at 612 after a very short duration of about 1 μs. Moreover, the voltage rapidly deceases instead of being constant as in FIG. 2. Consequently, there are no degradation effects on thin oxide layers in the device-under-test and thus no false ESD test results.

Figure 7:
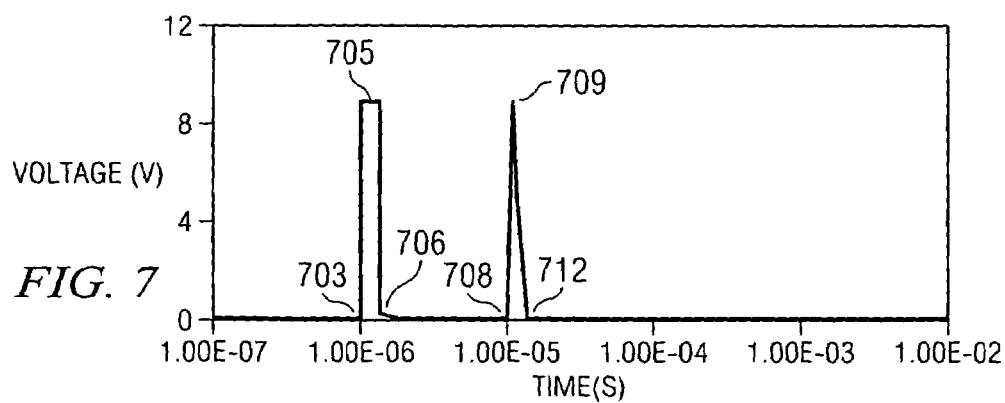
FIG. 7 displays the voltage (in V) vs. time (in s) curve across the device-under-test under HBM stress to illustrate the quantitative benefit of the pre-charge reduction circuit of the invention.

This improved situation is confirmed by the quantitative HBM voltage graph of FIG. 7, which uses the same voltage ordinate and the logarithmic time abscissa as FIG. 3 in order to allow a direct comparison of the oscilloscope readings. There are no early rise ringing and no pre-charge curve portions before the start of the HBM event, or test, at 703. The voltage level 705 (typically between 8 to 9 V) is determined by the clamp device (402 in FIG. 4). The HMB test ends at 706. After about 5 to 10 μs, there is a short pulse at 708 as a suppressed trailing pulse, but pulse 709 is inconsequential because its duration is only about 1 μs and it carries only little current; the pulse expires at 712. Pulse 709 does not have enough energy to cause any degradation of an oxide layer in the device-under-test.

Figure 8:
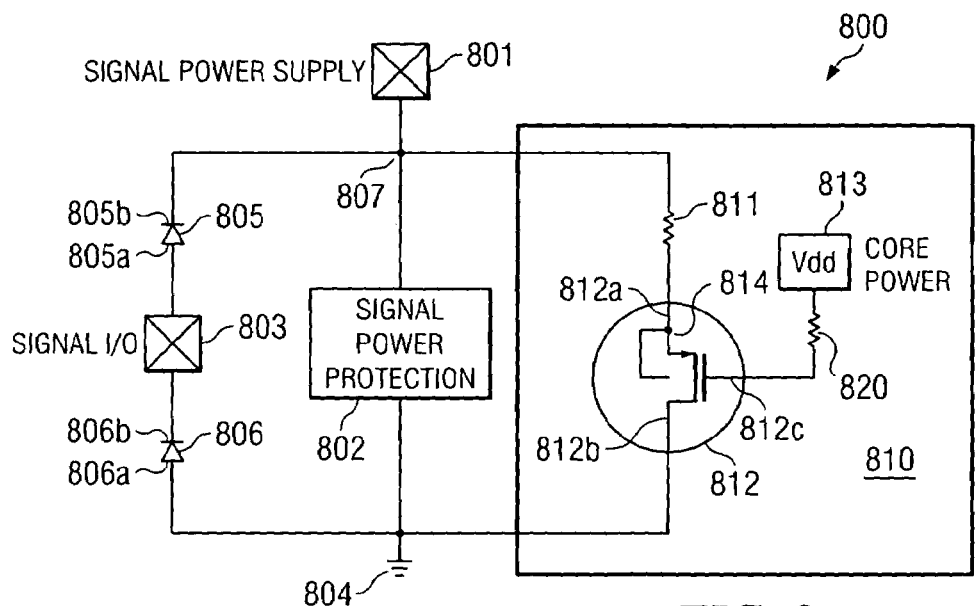
FIG. 8 is a schematic circuit diagram of another embodiment of the invention, the protection for signal supply pads of an IC.
Figure 9:
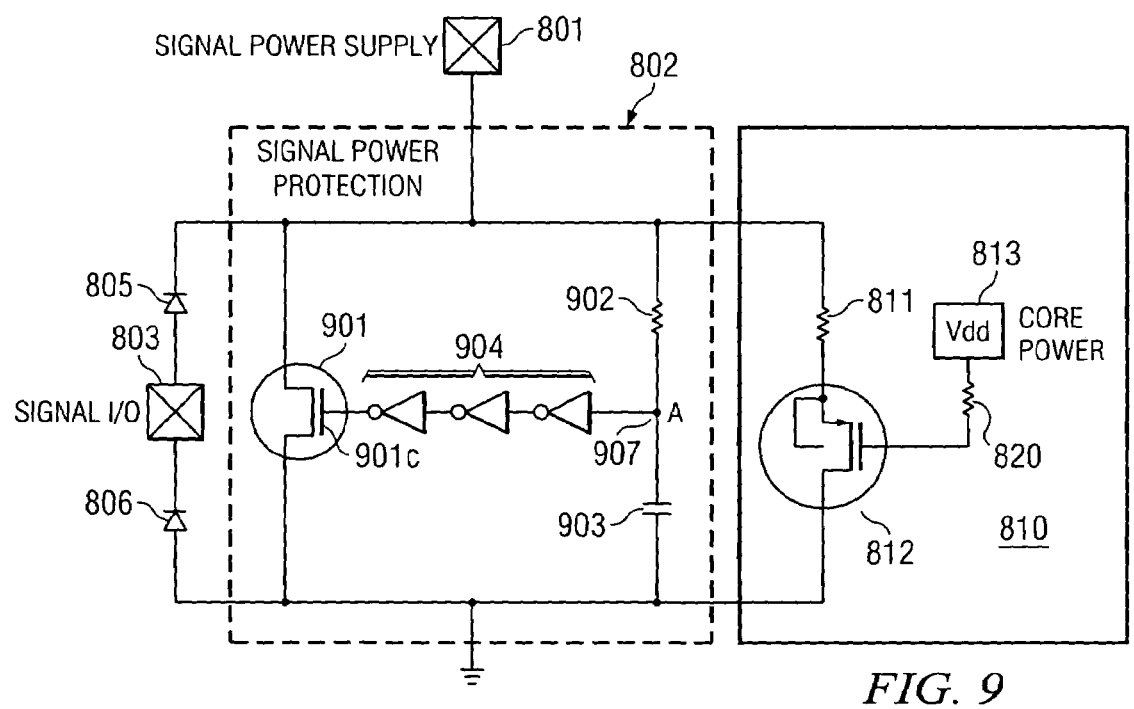
FIG. 9 displays more detail of the protection circuit for signal power supply pads as shown in FIG. 8.

Another embodiment of the invention, the circuitry for protecting a signal power supply pad 801 against an ESD pulse without interfering with regular IC operation, is illustrated in the schematic circuit diagram of FIG. 8, with more detail in FIG. 9. The circuitry of this embodiment is generally designated 800. Examples for the signal power supply 801 are Power, $V_{dd}$, $V_{cc}$, $V_{battery}$, and $V_{pp}$. Circuitry 800 is located in a semiconductor substrate of a first conductivity type, which, for example, may be p-type. Signal power protection circuit 802 for the signal power supply pad 801 is located in the substrate; this protection circuit 802 is operable to discharge an ESD pulse to ground 804. A signal pad 803 is located between the signal power supply pad 801 and ground potential pad 804. The circuitry further includes a first diode 805, which has its anode 805a connected to signal pad 803 and its cathode 805b connected to signal power supply pad 801. A second diode 806 has its anode 806a connected to ground pad 804 and its cathode 806b connected to signal pad 803.

A pre-charge reduction circuit 810 is in parallel with discharge circuit 802. This pre-charge circuit is operable to cancel any pre-charge voltage to ground before an ESD pulse, and also to discharge any trailing pulse to ground after an ESD pulse. The pre-charge reduction circuit 810 comprises a discharge resistor 811 in the substrate; the resistor is connected to signal power supply pad 801 and has preferably a value between about 1 and 100 kΩ, more preferably about 10 kΩ.

Pre-charge reduction circuit 810 further includes a control MOS transistor 812 in series with discharge resistor 811; this transistor is located in a well of the opposite conductivity type and has its source 812a connected to resistor 811. When the opposite conductivity type is n-type, transistor 812 is a pMOS transistor. Source 812a is also connected to the well so that there is no forward biasing diode. The transistor drain 812b is connected to ground 804, and the transistor gate 812c is connected through resistor 820 (between 1 and 10 kΩ) to core power pad 813 so that transistor 812 is shut off during IC operation and conducting when a pre-charge or post-charge is present at an ESD pulse (core power serves the internal IC, memory, logic, etc.). During an ESD event, core power 813 is at zero so that transistor 812 is allowed to conduct. If a pre-charge or a post-charge is present, resistor 811 and transistor 812 will conduct until node 807 is discharged to ground prior to the actual ESD event. The typical pre-charge time constant is hundreds of nanoseconds (see FIG. 3) and thus the pre-charge reduction circuit 810 has ample time to keep node 814 at zero potential before the ESD event occurs. Also, resistor 811 (preferably about 10 kΩ) has no impact on the protection device (802) operation, since the typical on-resistance of a protection clamp is 5 to 10 Ω.

The schematic circuit diagram of FIG. 9 depicts more detail about the signal power protection device 802. The protection of signal power supply pad 801 depends on the operation of the RC-timed circuit 802, which includes the large nMOS FET 901 (in the case of p-type substrates). Transistor 901 works in channel conduction mode during an ESD event; this means, transistor gate 901c is pulled high with a long time constant. Resistor 902 and capacitor 903 along with the three-inverter-stage 904 control the gate 901c of transistor 901 during an ESD event. Consequently, it would have a deleterious effect, if a pre-charge or a post-charge were present, because in those cases, node A (designated 907) would already be at a voltage of about 2 to 3 V and the efficiency of the signal power protection device 802 would thus be lost. The pre-charge reduction circuit 810 will ensure that node A remains at 0 V before the ESD event begins.

Figure 10:
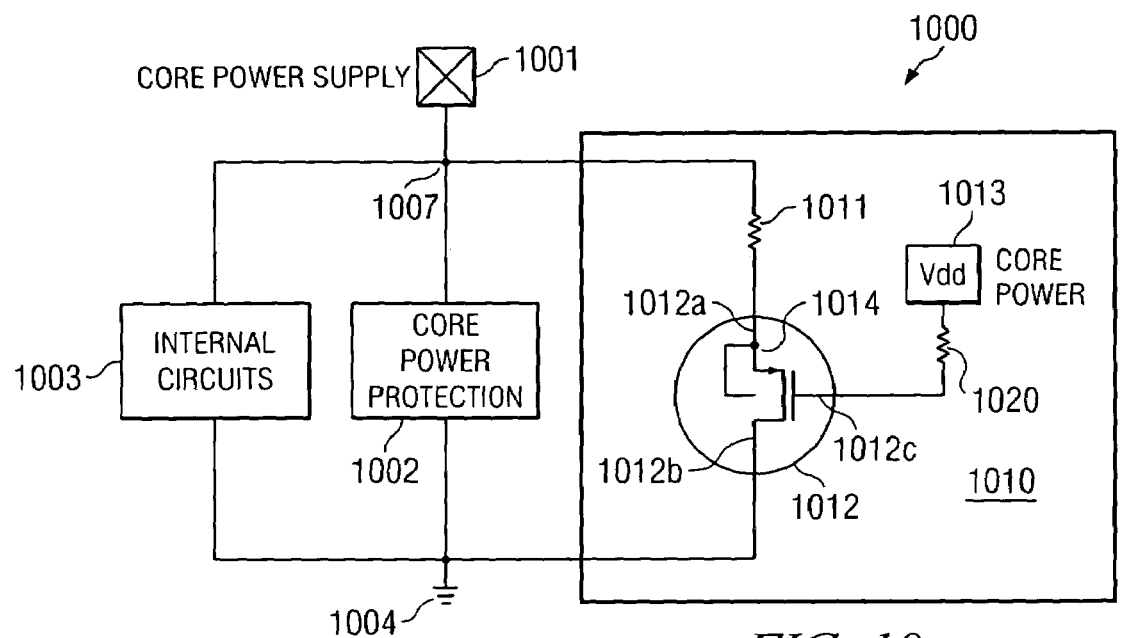
FIG. 10 is a schematic circuit diagram of another embodiment of the invention, the protection for core power supply pads of an IC.

Another embodiment of the invention, the circuitry for protecting a core power supply pad 1001 against an ESD pulse without interfering with regular IC operation, is illustrated in the schematic circuit diagram of FIG. 10. The circuitry of this embodiment is generally designated 1000. As before, core refers to the internal circuit such as memory, logic etc, of the IC. Circuitry 1000 is located in a semiconductor substrate of a first conductivity type, which, for example, may be p-type. Core power protection circuit 1002 for the core power supply pad 1001 is located in the substrate; this protection circuit 1002 is operable to discharge an ESD pulse to ground 1004. Internal circuits 1003 are located between the core power supply pad 1001 and ground potential pad 1004.

A pre-charge reduction circuit 1010 is in parallel with discharge circuit 1002. This pre-charge circuit is operable to cancel any pre-charge voltage to ground before an ESD pulse, and also to discharge any trailing pulse to ground after an ESD pulse. The pre-charge reduction circuit 1010 comprises a discharge resistor 1011 in the substrate; the resistor is connected to core power supply pad 1001 and has preferably a value between about 1 and 100 kΩ, more preferably about 10 kΩ.

Pre-charge reduction circuit 1010 further includes a control MOS transistor 1012 in series with discharge resistor 1011; this transistor is located in a well of the opposite conductivity type and has its source 1012a connected to resistor 1011. When the opposite conductivity type is n-type, transistor 1012 is a pMOS transistor. Source 1012a is also connected to the well so that there is no forward biasing diode. The transistor drain 1012b is connected to ground 1004, and the transistor gate 1012c is connected through resistor 1020 (between 1 and 10 kΩ) to signal power pad 1013 so that transistor 1012 is shut off during IC operation and conducting when a pre-charge or postcharge is present at an ESD pulse (signal power serves the signal I/O pads). During an ESD event, signal power 1013 is at zero so that transistor 1012 is allowed to conduct. If a pre-charge or a post-charge is present, resistor 1011 and transistor 1012 will conduct until node 1007 is discharged to ground prior to the actual ESD event. The typical pre-charge time constant is hundreds of nanoseconds (see FIG. 3) and thus the pre-charge reduction circuit 1010 has ample time to keep node 1014 at zero potential before the ESD event occurs. Also, resistor 1011 (preferably about 10 kΩ) has no impact on the protection device (1002) operation, since the typical on-resistance of a protection clamp is 5 to 10 Ω.

Figure 11:
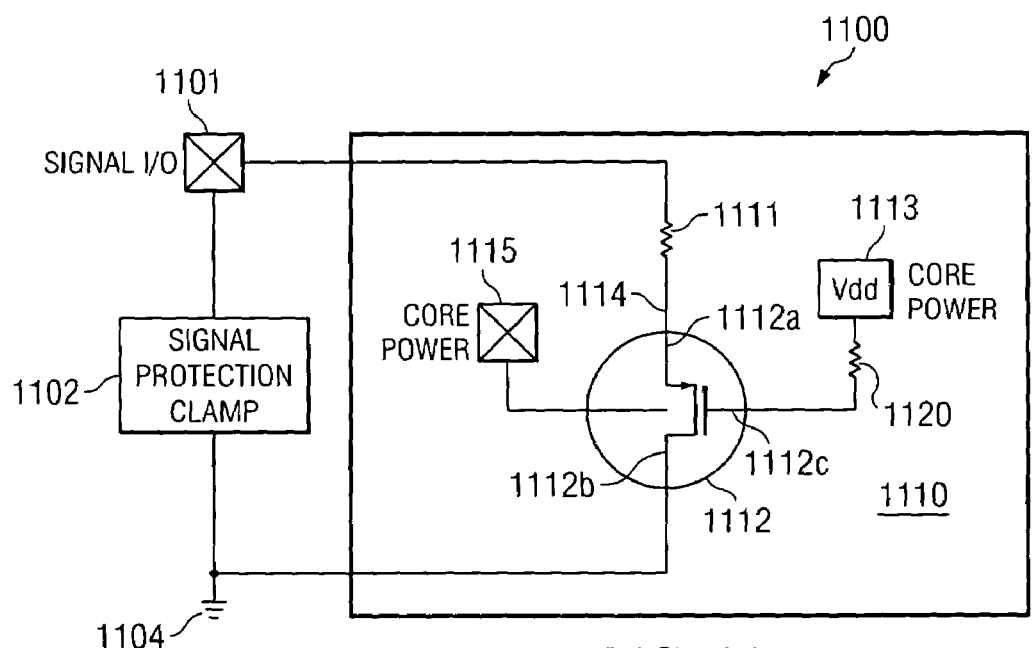
FIG. 11 is a schematic circuit diagram of another embodiment of the invention, the protection for signal I/O pads of an IC.

Another embodiment of the invention, the circuitry for protecting a signal (signal I/O) pad 1101 against an ESD pulse without interfering with regular IC operation, is illustrated in the schematic circuit diagram of FIG. 11. The circuitry of this embodiment is generally designated 1100. Circuitry 1100 is located in a semiconductor substrate of a first conductivity type, which, for example, may be p-type. Signal protection circuit 1102 for the signal pad 1101 is located in the substrate; this protection circuit 1002 is operable to discharge an ESD pulse to ground 1104.

A pre-charge reduction circuit 1110 is in parallel with discharge circuit 1102. This pre-charge circuit is operable to cancel any pre-charge voltage to ground before an ESD pulse, and also to discharge any trailing pulse to ground after an ESD pulse. The pre-charge reduction circuit 1110 comprises a discharge resistor 1111 in the substrate; the resistor is connected to signal pad 1101 and has preferably a value between about 1 and 100 kΩ, more preferably about 10 kΩ.

Pre-charge reduction circuit 1110 further includes a control MOS transistor 1112 in series with discharge resistor 1111; this transistor is located in a well of the opposite conductivity type and has its source 1112a connected to resistor 1111. When the opposite conductivity type is n-type, transistor 1112 is a pMOS transistor. The well is connected to core power 1115. The transistor drain 1112b is connected to ground 1104, and the transistor gate 1112c is connected through resistor 1120 (between 1 and 10 kΩ) to signal power pad 1113 so that transistor 1112 is shut off during IC operation and conducting when a precharge or post-charge is present at an ESD pulse (signal power serves the signal I/O pads). During an ESD event, signal power 1113 is at zero so that transistor 1112 is allowed to conduct. If a pre-charge or a postcharge is present, resistor 1111 and transistor 1112 will conduct until the pre-charge/post-charge is discharged to ground prior to the actual ESD event. The typical pre-charge time constant is hundreds of nanoseconds (see FIG. 3) and thus the pre-charge reduction circuit 1110 has ample time to keep node 1114 at zero potential before the ESD event occurs. Also, resistor 1111 (preferably about 10 kΩ) has no impact on the protection device (1102) operation, since the typical on-resistance of a protection clamp is 5 to 10 Ω.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in pMOS transistors as well as in nMOS transistors to create precharge reduction and ESD protection. As another example, the material of the semiconductor material may comprise silicon, silicon germanium, gallium arsenide, or any other semiconductor or compound material used in IC manufacturing. As yet another example, the concept of the invention is effective for many semiconductor device technology nodes and not restricted to a particular one. It is therefore intended that the appended claims encompass any such modifications or embodiments.

We claim:

1. Circuitry for protecting an integrated circuit (IC) input/output (I/O) pad against an ESD pulse without interfering with IC operations, comprising:
    a discharge circuit for said I/O pad operable to discharge said ESD pulse to ground; and a precharge reduction circuit in parallel with said discharge circuit, said precharge circuit operable to cancel any precharge voltage to ground before an ESD event, and also to discharge any trailing pulse to ground after an ESD event.

2. The protection circuit according to claim 1 wherein said precharge and said trailing pulse may be generated by an impending ESD event or by a test equipment function.

3. The protection circuit according to claim 1 wherein said precharge reduction circuit comprises:
    a discharge resistor connected to said discharge circuit; and
    a control MOS transistor in series with said discharge resistor, the transistor source connected to said resistor, the transistor drain connected to ground, and the transistor gate connected to power so that said transistor is shut off during IC operation and conducting when pre-charge or post-charge is present at an ESD pulse.

4. The protection circuit according to claim 3 wherein said discharge resistor is between about 1 and 100 kΩ.

5. The protection circuit according to claim 3 wherein said discharge resistor is about 10 kΩ.

6. The protection circuit according to claim 3 wherein said control MOS transistor is a pMOS transistor.

7. Circuitry for protecting a signal power supply pad against an ESD pulse without interfering with IC operations comprising:
    a substrate of a first conductivity type;
    a signal power protection circuit for said signal power supply pad in said substrate, said protection circuit operable to discharge said ESD pulse to ground;
    a signal pad located between said signal power supply pad and a ground potential pad;
    a first diode, its anode connected to said signal pad and its cathode connected to said signal power supply pad;
    a second diode, its anode connected to said ground pad and its cathode connected to said signal pad; and
    a precharge reduction circuit in parallel with said protection circuit, said precharge circuit operable to cancel any precharge voltage to ground before said ESD pulse, and also to discharge any trailing pulse to ground after said ESD pulse;
    said precharge reduction circuit comprising:
        a discharge resistor in said substrate, said resistor connected to said signal power supply pad; and
        a control MOS transistor in series with said discharge resistor, said transistor in a well of the opposite conductivity type, the transistor source connected to said resistor and to said well, the transistor drain connected to ground, and the transistor gate connected to core power so that said transistor is shut off during IC operation and conducting when precharge or post-charge is present at an ESD pulse.

8. The protection circuit according to claim 7 wherein said first conductivity type is p-type and the opposite conductivity type is n-type.

9. Circuitry for protecting a core power pad against an ESD pulse without interfering with device operations comprising:
    a substrate of a first conductivity type;
    a discharge circuit for said core power pad in said substrate, said discharge circuit operable to discharge said ESD pulse to ground;
    internal circuitry located between said core power pad and a ground potential pad; and
    a precharge reduction circuit in parallel with said discharge circuit, said precharge circuit operable to cancel any precharge voltage to ground before said ESD pulse, and also to discharge any trailing pulse to ground after said ESD pulse;
    said precharge reduction circuit comprising:
        a discharge resistor in said substrate, said resistor connected to said core power pad; and
        a control MOS transistor in series with said discharge resistor, said transistor in a well of the opposite conductivity type, the transistor source connected to said resistor and to said well, the transistor drain connected to ground, and the transistor gate connected to signal power so that said transistor is shut off during circuit operation and conducting when pre-charge or post-charge is present at an ESD pulse.

10. Circuitry for protecting a signal pad against an ESD pulse without interfering with device operations, comprising:
    a substrate of a first conductivity type;
    a discharge circuit for said I/O pad in said substrate, said discharge circuit operable to discharge said ESD pulse to ground; and
    a precharge reduction circuit in parallel with said discharge circuit, said precharge circuit operable to cancel any precharge voltage to ground before said ESD pulse, and also to discharge any trailing pulse to ground after said ESD pulse;
    said precharge reduction circuit comprising:
        a discharge resistor in said substrate, said resistor connected to said signal pad; and
        a control MOS transistor in series with said discharge resistor, said transistor in a well of the opposite conductivity type, said well connected to core power, the transistor source connected to said resistor, the transistor drain connected to ground, and the transistor gate connected to signal power so that said transistor is shut off during circuit operation and conducting when precharge or post-charge is present at an ESD pulse.

* * * * *